US009273410B2

(12) United States Patent
Bartl et al.

(10) Patent No.: US 9,273,410 B2
(45) Date of Patent: Mar. 1, 2016

(54) LOW-TEMPERATURE SYNTHESIS OF COLLOIDAL NANOCRYSTALS

(75) Inventors: Michael H. Bartl, Salt Lake City, UT (US); Jacqueline T. Siy, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 1137 days.

(21) Appl. No.: 13/142,182

(22) PCT Filed: Jan. 15, 2010

(86) PCT No.: PCT/US2010/021226
§ 371 (c)(1),
(2), (4) Date: Dec. 21, 2011

(87) PCT Pub. No.: WO2010/083431
PCT Pub. Date: Jul. 22, 2010

(65) Prior Publication Data
US 2012/0090533 A1 Apr. 19, 2012

Related U.S. Application Data

(60) Provisional application No. 61/145,477, filed on Jan. 16, 2009.

(51) Int. Cl.
*C30B 7/14* (2006.01)
*C30B 29/16* (2006.01)
*C30B 29/40* (2006.01)
(Continued)

(52) U.S. Cl.
CPC . *C30B 7/14* (2013.01); *C30B 29/16* (2013.01); *C30B 29/40* (2013.01); *C30B 29/46* (2013.01); *C30B 29/605* (2013.01)

(58) Field of Classification Search
CPC combination set(s) only.
See application file for complete search history.

(56) References Cited

U.S. PATENT DOCUMENTS 5,990,479 A 11/1999 Weiss et al.
6,194,213 B1 2/2001 Barbera-Guillem
(Continued)

FOREIGN PATENT DOCUMENTS

EP 1857575 11/2007
JP 2004096070 3/2004
(Continued)

OTHER PUBLICATIONS

Babcock et al. "Chemistry of Materials," Chemistry of Materials, 1998, vol. 10, No. 8.
(Continued)

*Primary Examiner* — Duy Deo
*Assistant Examiner* — Erin Bergner
(74) *Attorney, Agent, or Firm* — Workman Nydegger (57) ABSTRACT

Low-temperature organometallic nucleation and crystallization-based synthesis methods for the fabrication of semiconductor and metal colloidal nanocrystals with narrow size distributions and tunable, size- and shape-dependent electronic and optical properties. Methods include (1) forming a reaction mixture in a reaction vessel under an inert atmosphere that includes at least one solvent, a cationic precursor, an anionic precursor, and at least a first surface stabilizing ligand while stirring at a temperature in a range from about 50° C. to about 130° C. and (2) growing nanocrystals in the reaction mixture for a period of time while maintaining the temperature, the stirring, and the inert-gas atmosphere.

43 Claims, 3 Drawing Sheets

(51) Int. Cl.
*C30B 29/46* (2006.01)
*C30B 29/60* (2006.01)

(56) References Cited

U.S. PATENT DOCUMENTS

| | | | |
|---|---|---|---|
| 6,207,229 | B1 | 3/2001 | Bawendi et al. |
| 2003/0106488 | A1 | 6/2003 | Huang et al. |
| 2003/0212173 | A1 | 11/2003 | Owens et al. |
| 2004/0247503 | A1* | 12/2004 | Hyeon .............................. 423/1 |
| 2005/0036938 | A1* | 2/2005 | Hyeon ....................... 423/561.1 |
| 2006/0130741 | A1* | 6/2006 | Peng et al. ....................... 117/68 |
| 2007/0264834 | A1 | 11/2007 | Strouse et al. |
| 2008/0112877 | A1 | 5/2008 | Xiao et al. |
| 2008/0124268 | A1* | 5/2008 | Yang et al. .................... 423/511 |
| 2008/0160306 | A1 | 7/2008 | Mushtaq et al. |

FOREIGN PATENT DOCUMENTS

| | | |
|---|---|---|
| JP | 2004510678 | 4/2004 |
| JP | 2006143526 | 6/2006 |
| JP | 2007155395 | 6/2007 |
| JP | 2007181810 | 7/2007 |
| JP | 2008515746 | 5/2008 |
| JP | 2008523217 | 7/2008 |
| JP | 2012515138 | 7/2012 |
| WO | 2006125965 | 11/2006 |
| WO | 2010083431 | 7/2010 |

OTHER PUBLICATIONS

Gao et al. "Strongly Photoluminescent CdTe Nanocrystals by Proper Surface Modification," Journal of Physical Chemistry B, 1998, vol. 102, pp. 8360-8363.

Gerion et al. "Synthesis and Properties of Biocompatible Water-Soluble Silica-Coated CdSE/ZnS Semiconductor Quantum Dots," Journal of Physical Chemistry B, 2001, vol. 105, pp. 8861-8871.

International Search Report and Written Opinion for PCT/US2010/21226 dated Mar. 16, 2010.

Kortan et al. "Nucleation and Growth of CdSe on ZnS Quantum Crystallite Seeds, and Vice Versa, in Inverse Micelle Media," Journal of American Chemical Society, 1990, 112:1327-1332.

Mattoussi et al. "Self-Assembly of CdSe—ZnS Quantum Dot Bioconjugates Using an Engineered Recombinant Protein," Journal of the American Chemical Society, 2000, 122:1242-12150.

Murray et al. "Synthesis and Characterization of Nearly Monodisperse CdE (E=S, Se, Te) Semiconductor Nanocrystallites," Journal of the American Chemical Society, 1993, 115:8706-8715.

Qu et al. "Control of Photoluminescence Properties of CdSe Nanocrystals in Growth," Journal of the American Chemical Society, 2002, p. 2049-2055.

Rogach et al. "Synthesis and Characterization of a Size Series of Extremely Small Thiol-Stabilized CdSe Nanocrystals," Journal of Physical Chemistry B, 1999, vol. 103, 3065-3069.

Search Report for EP10732161 dated Sep. 30, 2014.

Talapin et al. "Highly Luminescent Monodisperse CdSe and CdSe/ZnS Nanocrystals Synthesized in a Hexadecylamine-Trioctylphosphine Oxide-Trioctylphospine Mixture," Nano Letters, 2001, vol. 1, No. 4, pp. 207-211.

Talapin, et al. "Synthesis and Surface Modification of Amino-Stabilized CdSe, CdTe and InP Nanocrystals," Colloids and Surfaces A, 2002, vol. 202, pp. 145-154.

Winter et al. "Recognition Molecule Directed Interfacing Between Semiconductor Quantum Dots and Nerve Cells," Advanced Materials, 2001, vol. 13, Issue 22, pp. 1673-1677.

Wuister et al. "Highly Luminescent Water-Soluble CdTe Quantum Dots," Nano Letters, 2003, vol. 3, No. 4, pp. 503-507.

Yukselici et al. "Optical Studies of Growth of Cd1-xZnxS Nanocrystals in Borosilicate Glass," Physical Review B, 1995, vol. 52, No. 16, pp. 11763-11772.

* cited by examiner

LOW-TEMPERATURE SYNTHESIS OF COLLOIDAL NANOCRYSTALS

CROSS-REFERENCE TO RELATED APPLICATIONS

This application claims the benefit of and priority to U.S. Provisional Patent Application Ser. No. 61/145,477 to Bartl et al. entitled "METHOD FOR THE LOW-TEMPERATURE SYNTHESIS OF COLLOIDAL NANOCRYSTALS WITH NARROW SIZE DISTRIBUTION" filed 16 Jan. 2009, the entirety of which is incorporated herein by reference.

GOVERNMENT LICENSE RIGHTS

This invention was made with government support under grant number ECS0609244 awarded by National Science Foundation. The government has certain rights in the invention.

BACKGROUND

1. The Field of the Invention

The present invention relates to nanocrystals and methods for their synthesis. In particular, the present invention relates to methods for low-temperature synthesis of colloidal nanocrystals having a narrow size distribution.

2. The Relevant Technology

Nanocrystals are small crystallites of semiconductors or metals with various shapes (dots, rods, fibers, tetrapods and other geometries) and sizes ranging from 1 to 100 nm. For example, a so-called quantum dot is a semiconductor whose excitons are confined in all three spatial dimensions. The most striking feature of semiconductor and metal nanocrystals is that in contrast to bulk material, their electronic and optical properties are dependent on particle size and shape and therefore can be continuously controlled over a large range.

These unique features make nanocrystals important candidates for advanced applications in areas as diverse as nano-electronics, nano-photonics, solid-state lightning, energy conversion and storage, and health science. For example, nanocrystals are considered key components for next-generation single-photon generation and detection, encryption, micro-lasing and solar energy conversion. In addition, nanocrystals are intensively studied in biological labeling and imaging as well as for targeted drug delivery. For example, nanocrystals are considered to be superior for use as dyes in biological labeling and imaging when compared to conventional molecular dyes because nanocrystal dyes are brighter and they are not generally subject to photo-bleaching.

This wide range of potential applications has sparked research into the development of robust and universal synthesis routes for the fabrication of nanocrystals with adjustable sizes and shapes. Outstanding in these efforts is the work of Murray, Norris and Bawendi in 1993, who reported a relatively simple and robust solution-based synthesis route for the preparation of nearly monodisperse semiconducting cadmium chalcogenide (CdS, CdSe and CdTe) semiconductor nanocrystal quantum dots. Their technique uses colloidal crystal-nucleation and growth chemistry at a temperature in range of about 200° C. to about 350° C. in the presence of a long alkyl-chain surfactant/solvent system. Example solvents include long-chain alkylphosphines, long-chain alkylphosphine oxides, and long-chain alkenes. The solvent/surfactant system used in high-temperature synthesis methods is generally quite expensive and the solvent/surfactant system is generally not reusable from reaction to reaction.

Following the Bawendi Group's discovery, widespread research has been devoted to the synthesis of various types of nanocrystalline materials. While slight modifications of the original Bawendi method in terms of organometallic precursor species and reaction and crystallizations conditions (concentration of reaction components, solvents, growth time, etc.) have resulted in the development of a wealth of nanocrystals with different compositions, sizes, and shapes, it is interesting to note that the typical synthesis conditions are all based on the original high-temperature (e.g., 200-350° C. for cadmium chalcogenide nanocrystals) crystallite nucleation and growth route.

SUMMARY

The present disclosure describes low-temperature organometallic nucleation and crystallization-based synthesis methods for the fabrication of high-quality semiconductor and metal colloidal nanocrystals (small crystallites of semiconductors or metals composed of a few to several thousands of atoms) with narrow size distributions and tunable, size- and shape-dependent electronic and optical properties. The methods described herein enable synthesis of colloidal nanocrystals at low temperatures (e.g., about 15° C. to about 130° C.). Nanocrystals are widely considered as the cornerstones of emerging energy, information, and biological technologies due to their unique size- and shape-related tunable electronic and optical properties. Low-temperature synthesis methods provide higher product quality and they can be scaled-up for high-throughput fabrication with reduced engineering requirements/restrictions. Furthermore, synthesis at low temperatures allows the use (and re-use) of conventional solvents, co-solvents, reaction vessels, and other components.

In one embodiment, the present invention includes a method for synthesizing nanocrystals. The method includes (1) forming a reaction mixture in a reaction vessel while stirring under an inert-gas atmosphere at a temperature in a range from about 15° C. to about 130° C. and (2) growing nanocrystals in the reaction mixture for a period of time between about 1 minute and about 96 hours while maintaining the temperature, the stirring, and the inert-gas atmosphere. In one embodiment, the reaction mixture includes at least one solvent, a cationic precursor, an anionic precursor, and at least a first surface stabilizing ligand.

In a second embodiment, another method for synthesis of nanocrystals is disclosed. The method includes a first step of forming a reaction mixture under an inert atmosphere. The reaction mixture includes at least one solvent selected from the group consisting of an alkane, an alkene, a phenyl ether, a chloro alkane, a fluoro alkane, toluene, or squalene, and combinations thereof, a cationic precursor including at least one organometallic compound of cadmium, lead, zinc, mercury, gold, silver, cobalt, platinum, nickel, iron, or copper, an anionic precursor including at least one sulfide, selenide, telluride, oxide, phosphide, nitride, or arsenide, and at least a first surface stabilizing ligand having an aliphatic chain that includes at least four carbon atoms selected from the group consisting of an alkyl carboxylic acid, an alkyl amine, an alkyl phosphine, an alkyl phosphonic acid, an alkyl sulfide, and combinations thereof The method further includes stirring the reaction mixture under an inert-gas atmosphere at a temperature in a range from about 15° C. to about 130° C., growing nanocrystals in the reaction mixture while maintaining the temperature, the stirring, and the inert-gas atmosphere, and purifying the nanocrystals from the reaction mixture.

In a third embodiment, yet another method for colloidal synthesis of nanocrystals is disclosed. The method includes (1) providing a cationic precursor mixture, (2) providing an anionic precursor mixture, (3) providing a reaction solution, (4) heating each of the cationic precursor mixture, the anionic precursor mixture, and the reaction solution to a temperature in a range from about 50° C. to about 130° C. while stirring under an inert-gas atmosphere, (5) injecting a quantity of the cationic precursor mixture and a quantity of the anionic precursor mixture into the reaction solution while maintaining the temperature, the stirring, and the inert-gas atmosphere, so as to form a reaction mixture, and (6) reacting the cationic precursor mixture and the anionic precursor mixture in the reaction mixture while maintaining the temperature, the stirring, and the inert-gas atmosphere for a period of time between about 1 minute and about 96 hours so as to form the nanocrystals.

In one aspect, the cationic precursor mixture may include at least one cationic precursor material, at least a first surface stabilizing ligand, and at least one solvent.

In another aspect, the anionic precursor mixture may include at least one anionic precursor material, at least one anionic precursor ligand, and at least one solvent.

In yet another aspect, the reaction solution may include at least a second surface stabilizing ligand and at least one solvent, wherein the second surface stabilizing ligand may be the same or different than the first surface stabilizing ligand included in the cationic precursor mixture.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

1. Introduction

The present disclosure describes low-temperature organometallic nucleation and crystallization-based synthesis methods for the fabrication of high-quality semiconductor and metal colloidal nanocrystals with narrow size distribution and tunable, size- and shape-dependent electronic and optical properties. The methods described herein enable synthesis of colloidal nanocrystals at low temperatures (e.g., about 15° C. to about 130° C.). The methods described herein are based at least in part on manipulation of the concentration ratio of surface stabilizing ligand (i.e., surfactant) to reaction precursor species, overall reaction species concentrations, and reaction temperature in order to achieve kinetic and/or thermodynamic control over the reaction. Under these conditions nucleation of nanocrystals is kinetically induced at much lower temperatures compared to conventional methods via selection of surface stabilizing ligand concentration, and low-temperature growth of these nanocrystals is thermodynamically as well as kinetically driven via selection of reaction species concentration.

The temperature during the growth process is one important factor in determining conditions for the nanocrystal growth. The reaction temperature should be high enough to allow for rearrangement and annealing of atoms during the synthesis process while being low enough to promote crystal growth. Temperature also affects the kinetics of the reaction. The temperature used in the methods described herein can be in a range from about 15° C. to about 130° C. One will appreciate, however, that the nanocrystal formation process will proceed quite slowly at temperatures as low as 15° C. Although it may take several days to for detectable nanocrystal growth to occur. Preferably, the reaction end of the reaction temperature range should be at least about 35° C., about 45° C., or at least about 50° C. in order for the reaction to proceed at an appreciable rate.

Another important factor in nanocrystal growth is monomer concentration. Monomer concentration can affect the size, the shape, and the number of crystallites grown in a reaction mixture. For example, the growth process of nanocrystals can occur in two different regimes, "focusing" and "defocusing". At high monomer concentrations, the critical size (the size where nanocrystals neither grow nor shrink) is relatively small, resulting in growth of nearly all particles. In this regime, smaller particles grow faster than large ones (since larger crystals need more atoms to grow than small crystals) resulting in "focusing" of the size distribution to yield nearly monodisperse particles. The size focusing is optimal when the monomer concentration is kept such that the average nanocrystal size present is always slightly larger than the critical size. When the monomer concentration is depleted during growth, the critical size becomes larger than the average size present, and the distribution "defocuses" as a result of Ostwald ripening.

Another important factor in nanocrystal growth is the concentration and/or composition of surface stabilizing ligands. Surface stabilizing ligands play two possible roles in the nanocrystal growth process. In one role, the surface stabilizing ligands bind to ionic precursor materials in solution, thus stabilizing the solution state of the ions, thus disfavoring crystal growth. In another role, the surface stabilizing ligands bind to the surface of the growing nanocrystals, thus stabilizing the nanocrystals and affecting their growth rate by reducing the effective surface area of the crystals. In addition, because different faces of the nanocrystals have different surface energies and therefore different bonding energies vis-à-vis the surface stabilizing ligands, surface stabilizing ligand concentration can be used to favor certain nanocrystal shapes (e.g., spheroids vs. rods vs. tetrapods). For example, rod formation can be favored in the c direction if faces defined by the a and b coordinate axes are saturated with ligand while faces defined by the c coordinate axis are open.

In one example, in order to fabricate semiconducting cadmium selenide colloidal nanocrystals via this low-temperature synthesis route, cadmium precursor and selenium precursor are injected into a solvent in the presence of surface stabilizing ligands at temperatures of about 50° C. to about 130° C. under vigorous stirring of the reaction mixture and under an inert gas atmosphere.

Figure 1:
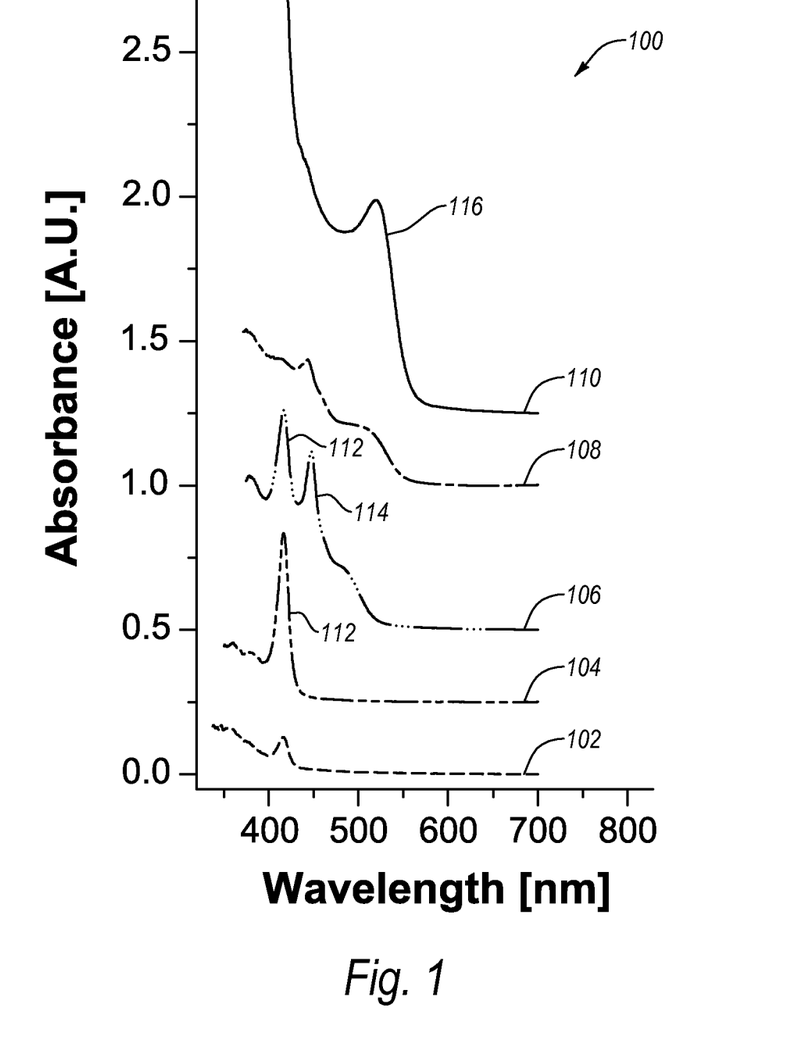
FIG. 1 illustrates UV-vis absorption spectra of CdSe nanocrystals at various stages of a low-temperature growth process at 100° C.

A few minutes after the injection of the precursor solutions into the reaction mixture, the formation of cadmium selenide colloidal crystal nuclei and growth into crystallites is indicated by a slight yellowish coloration of the initially colorless reaction mixture. Growth of the microcrystals can also be monitored spectroscopically. For example, FIG. 1 illustrates a series of UV-vis absorption traces 100 as CdSe nanocrystals grow over time. FIG. 1 illustrates the UV-vis absorption of samples taken after 5 minutes 102, 60 minutes 104, 21 hours 106, 96 hours 108, and 141 hours 110 of CdSe nanocrystal growth at 100° C.

The formation of cadmium selenide colloidal crystal nuclei and growth into crystallites is indicated by the appearance of a distinct sharp peak 112 in the UV-vis absorption spectrum of traces 104 and 106. Subsequently, steady growth of the formed crystallites and transformation of the initial clusters into larger crystallites is evidenced by the appearance of a second absorption peak 114 at higher wavelength and reduction of the initial absorption peak 112.

The transformation of these initial cadmium selenide small crystallites with defined cluster sizes into larger nanocrystals is indicated by the advent of a shoulder peak 116 in the UV-vis absorption spectrum of the crystallites and a steady red-shifting towards longer wavelengths with time, which can be seen in traces 108 and 110. The red-shift is the direct result of the creation of strongly confined excitons in nanocrystals with increasing size upon light illumination.

Figure 2:
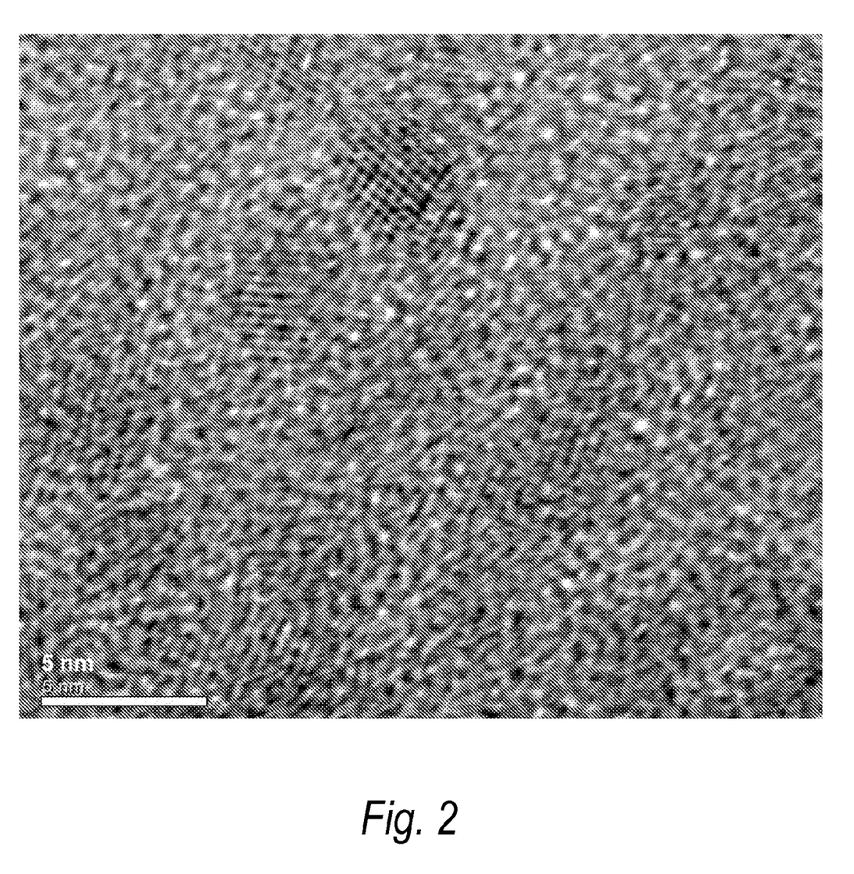
FIG. 2 illustrates a transmission electron microscopy image of CdSe nanocrystals synthesized at 100° C., showing well-defined shapes and lattice fringes.

The formation and subsequent growth of cadmium selenide nanocrystals by the low-temperature synthesis method disclosed herein is also evidenced by transmission electron microscopy studies. Referring now to FIG. 2, a representative transmission electron micrograph shows the presence of CdSe crystalline nanoparticles grown at 100° C. with monodisperse size distribution, well-defined faces, and well-defined crystalline lattice lines at a given reaction time.

Figure 3A:
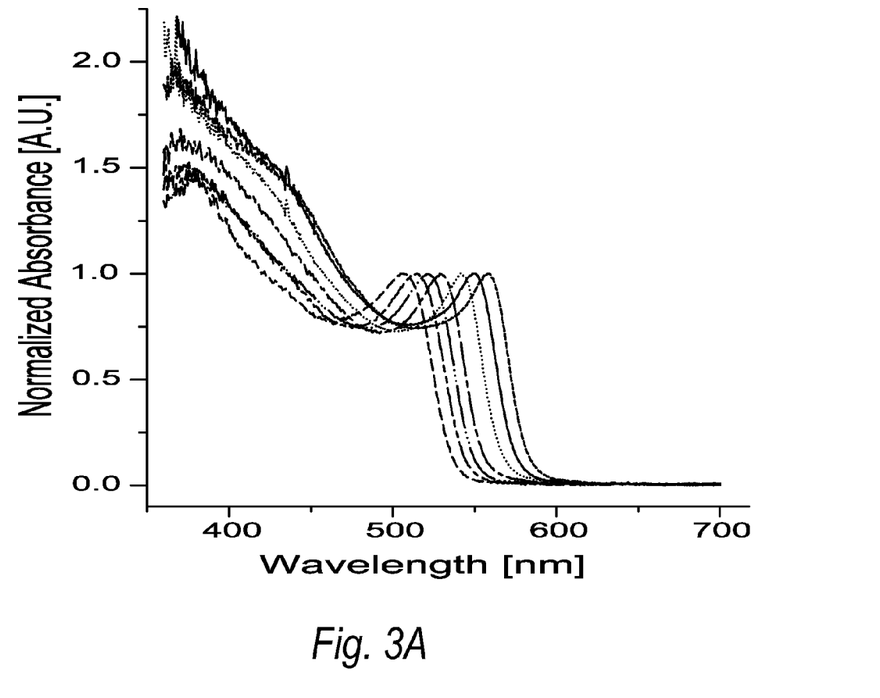
FIG. 3A illustrates a series of UV-vis absorption spectra of CdSe nanocrystals with different sizes synthesized at 100° C., showing different light absorption properties of nanocrystals as a function of nanocrystal size.

Due to the lower temperature compared to traditional high-temperature synthesis routes, the nanocrystal growth rate in the methods disclosed herein is slowed. This enables facile control of the size of the final nanocrystals. FIG. 3A illustrates a series of UV-vis absorption spectra of CdSe nanocrystals with different sizes synthesized at 100° C., showing different light absorption properties of nanocrystals as a function of nanocrystal size. When the nanocrystals have reached the desired size, as monitored spectroscopically or as a function of reaction time, the growth reaction can be stopped by simply cooling the reaction mixture to room temperature. The synthesized nanocrystals are separated from the growth solution by extraction, precipitation, centrifugation and re-dissolution in fresh solvent.

An important measure of the crystalline and surface quality of colloidal nanocrystals is their luminescence upon irradiation with light (photoluminescence). The wavelength of light emitted by a nanocrystal (i.e., excited light emission or photoluminescence) is a function of the nanocrystal's size—as size increases, there is a steady shift to longer emitted wavelengths (i.e., a red-shift). A population of high-quality, monodisperse colloidal nanocrystals will display a sharp emission peak, whereas polydisperse colloidal nanocrystals will display a broadened emission spectrum.

Figure 3B:
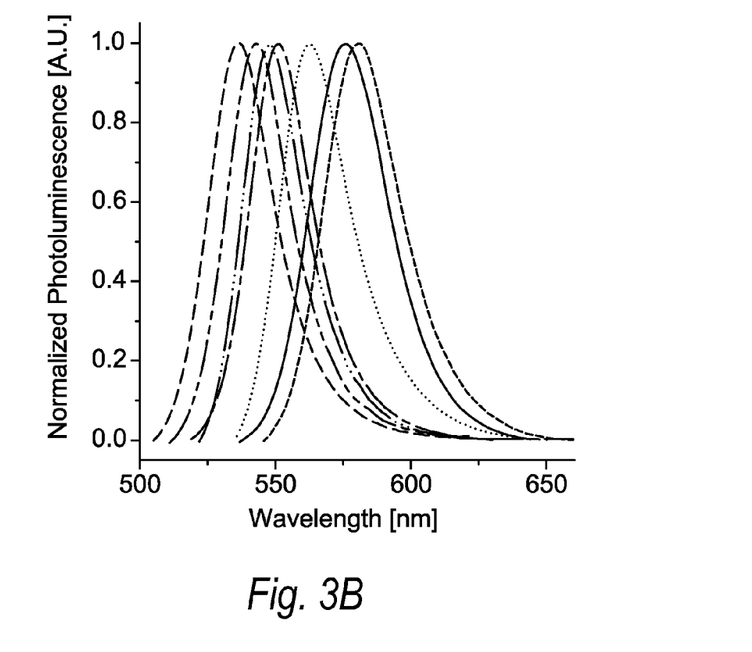
FIG. 3B illustrates a series of photoluminescence emission spectra of CdSe nanocrystals with different sizes synthesized at 100° C., showing different photoemission properties of nanocrystals as a function of nanocrystal size.

FIG. 3B illustrates photoluminescence spectra of cadmium selenide nanocrystals fabricated by the synthesis method described herein and excited (illuminated) by UV-light of 365 nm. These studies not only evidence excellent photoluminescence intensities of the synthesized nanocrystals, but also reveal the desired sharp emission spectra and the quantum size effect displayed by the creation of different photoluminescence emission colors as a function of nanocrystal size (from blue to red as the diameter of the synthesized individual monodisperse nanocrystal samples increases from about 1 nm to about 6 nm).

2. Methods of Synthesis

The present disclosure relates to methods for the synthesis of nanocrystals (i.e., nanoparticles). In particular, the present disclosure describes an organometallic nucleation and crystallization based synthesis route for the fabrication of high-quality colloidal nanocrystals having a narrow size distribution and tunable (i.e., size-dependent) electronic and optical properties. The methods described in this disclosure are based on a low-temperature nucleation and crystal growth route (e.g., about 15° C. to about 130° C.) in which anionic and cationic precursor materials are reacted to form nanocrystals in the presence of an inert solvent and a surface stabilizing ligand. Reaction conditions (e.g., temperature, concentration of reactants, or concentration of surface stabilizing ligands) can be tuned to control the size and shape of the nanocrystals that are synthesized.

In one embodiment, a method for colloidal synthesis of nanocrystals includes (1) forming a reaction mixture in a reaction vessel while stirring under an inert-gas atmosphere at a temperature in a range from about 15° C. to about 130° C., and (2) growing nanocrystals in the reaction mixture for a period of time between about 1 minute and about 96 hours while maintaining the temperature, the stirring, and the inert-gas atmosphere. In one embodiment, the reaction mixture used to grow the nanocrystals includes at least one inert solvent, a cationic precursor, an anionic precursor, and at least a first surface stabilizing ligand.

The reaction temperature used in the methods described herein can be in a range from about 15° C. to about 130° C., about 35° C. to about 130° C., about 50° C. to about 130° C., or an temperature therebetween. One will appreciate, however, that the nanocrystal formation process will proceed quite slowly at temperatures as low as 15° C. For example, at 15° C., it may take several days to for detectable nanocrystal growth to occur. Preferably, the reaction end of the reaction temperature range should be at least about 35° C., about 45° C., or at least about 50° C. in order for the reaction to proceed at an appreciable rate.

Suitable examples of solvents include, but are not limited to alkanes, alkenes, phenyl ethers, chloro alkanes, fluoro alkanes, toluene, or squalene. In a preferred embodiment, the inert solvent is octadecene. Preferably the solvent is an inert solvent.

Choice of solvent can also affect the choice of reaction temperature. In one embodiment, for example, the selected solvent may have a boiling point in a range from about 80° C. to about 350° C. Preferably, the solvent has a boiling point in a range from about 100° C. to about 300° C. More preferably, the solvent has a boiling point in a range from about 110° C. to about 280° C. If, for example, solvents were chosen having boiling points on the low end of these recited ranges, then it may not be possible to run the reaction at a temperature higher than 80° C., 100° C., or 110° C. In the alternative, it may be possible to conduct the synthesis reaction in boiling solvent by including a reflux head or another means on the reaction vessel to prevent evaporation of the solvent.

Examples of suitable surface stabilizing ligands that can be included in the reaction mixture include alkyl carboxylic acids, alkyl amines, alkyl phosphines, alkyl phosphonic acids, or alkyl sulfides, and combinations thereof. Preferably, the surface stabilizing ligand has an aliphatic chain that includes at least four carbon atoms.

In one embodiment, the cationic precursor includes at least one cationic precursor material, at least a second surface stabilizing ligand that may be the same as or different than the first surface stabilizing ligand, and at least one inert solvent.

Examples of suitable cationic precursor materials include organometallic compounds of cadmium, lead, zinc, mercury, gold, silver, cobalt, platinum, nickel, iron, or copper. In one embodiment, the organometallic compound includes metallic $C_2$-$C_{20}$ carboxylic acid salts, and derivatives thereof.

In one embodiment, the anionic precursor includes at least one anionic precursor material, at least one anionic precursor ligand, and at least one inert solvent.

In one embodiment, the anionic precursor material can include at least one sulfide, selenide, telluride, oxide, phosphide, nitride, or arsenide. One will of course appreciate that terms such as sulfide or selenide refer to oxidation states of sulfur and selenium and that, as such, the sulfide or selenide species include a counter-ion or a ligand. According to the present disclosure, the anionic precursor material can be added to the reaction mixture already bound to its ligand, or the sulfide, selenide, telluride, oxide, phosphide, nitride, or arsenide species can be formed in situ by reacting with an anionic precursor ligand.

Accordingly, suitable examples of anionic precursor ligands include trialkylphosphines. In one embodiment, the trialkylphosphine can be selected from the group consisting of trimethylphosphine, triethylphosphine, tributylphosphine, tripropylphosphine, tripentylphosphine, trihexylphosphine, triheptylphosphine, trioctylphosphine, triphenyl phosphine, tris(p-anisyl)phosphine, tri-n-butylphosphine, tris(p-tolyl)phosphine, tri-n-propylphosphine, tricyclohexyl phosphine, tris(hydroxymethyl)phosphine, tris(2-cyanoethyl)phosphine, tri-isobutylphosphine, tris(3-hydroxypropyl) phosphine, di-tert-butylmethylphosphine, tris(o-tolyl)phosphine, tris(m-tolyl)phosphine, tricyclopentylphosphine, tert-butyldimethylphosphine, n-butyldicyclohexylphosphine, or (2-biphenylyl)di-tert-butylphosphine, and combinations thereof. In a preferred embodiment, the trialkylphosphine is trioctylphosphine.

Suitable examples of inert gases that can be used to provide an inert gas atmosphere (i.e., a non-reactive, moisture-free atmosphere) include, but are not limited to, argon, nitrogen, helium, and the like.

In one embodiment, the method disclosed herein further includes monitoring the growing of the nanocrystals using UV-vis absorption spectroscopy, photoluminescence emission spectroscopy, and/or transmission electron microscopy. UV-vis absorption spectroscopy, photoluminescence emission spectroscopy, and/or transmission electron microscopy can be used to monitor the size, shape, and monodispersity of the nanocrystals as they grow. For example, the photoluminescence emission spectroscopy can be used to monitor the size of the growing nanocrystals because the emission spectrum red-shifts over time as the crystals become larger. Photoluminescence emission spectroscopy can also be used routinely to monitor the degree of monodispersity of the growing nanocrystals owing to the fact that a population of nanocrystals having a discrete size will exhibit a sharp emission peak, whereas polydisperse nanocrystals will show a broadened emission spectrum.

Crystalline clusters of two or more molecules (e.g., crystallites of two or more CdSe molecules) can have interesting and useful electronic and optical properties. Thus the lower size range of crystalline nanoparticles that can be grown using the methods disclosed herein is limited only by the size of the molecules. For example, a crystalline cluster few CdSe molecules may have a size on the order of a few tenths of a nanometer. The upper size of nanocrystalline particles that can be grown using the methods described herein is about 100 nm. Preferably, the nanoparticles grown using the methods described herein have a size of less than about 100 nm in one or more dimensions (e.g., along the a, b, and c coordinates axes), less than about 80 nm one or more dimensions, less than about 50 nm one or more dimensions, less than about 40 nm one or more dimensions, less than about 30 nm one or more dimensions, less than about 20 nm one or more dimensions, less than about 15 nm one or more dimensions, less than about 10 nm one or more dimensions, less than about 5 nm one or more dimensions. Preferably, the nanocrystals synthesized according the methods described herein have a size less than about 30-40 nm.

When the nanocrystals reach their desired size (as determined by reaction time or one or more monitoring techniques), the growth of the nanocrystals can be slowed significantly or stopped by cooling the reaction mixture to ambient temperature.

Once the reaction has been slowed or stopped by cooling, the nanocrystals can be purified from the reaction mixture. An exemplary purification method includes (1) extracting the nanocrystals from the reaction mixture using at least one solvent that is immiscible in the reaction mixture, (2) precipitating the nanocrystals out of the extraction solvent and separating the precipitated nanocrystals from the extraction solvent by centrifugation, (3) suspending the nanocrystals in a fresh solvent. Appropriate fresh solvents include, but are not limited to, hexanes, toluene, and/or chloroform. The purified and resuspended nanocrystals can be characterized and/or used in a variety of experiment or techniques.

In one embodiment, another method for synthesis of nanocrystals is disclosed. The method includes a first step of forming a reaction mixture under an inert atmosphere. The reaction mixture includes at least one solvent selected from the group consisting of an alkane, an alkene, a phenyl ether, a chloro alkane, a fluoro alkane, toluene, or squalene, and combinations thereof, a cationic precursor including at least one organometallic compound of cadmium, lead, zinc, mercury, gold, silver, cobalt, platinum, nickel, iron, or copper, an anionic precursor including at least one sulfide, selenide, telluride, oxide, phosphide, nitride, or arsenide, and at least a first surface stabilizing ligand having an aliphatic chain that includes at least four carbon atoms selected from the group consisting of an alkyl carboxylic acid, an alkyl amine, an alkyl phosphine, an alkyl phosphonic acid, an alkyl sulfide, and combinations thereof The method further includes stirring the reaction mixture under an inert-gas atmosphere at a temperature in a range from about 15° C. to about 130° C., growing nanocrystals in the reaction mixture while maintaining the temperature, the stirring, and the inert-gas atmosphere, and purifying the nanocrystals from the reaction mixture.

In one embodiment, the present invention includes a method for colloidal synthesis of nanocrystals including (1) providing a cationic precursor mixture that includes at least one cationic precursor material, at least a first surface stabilizing ligand, at least one inert solvent; (2) providing an anionic precursor mixture that includes at least one anionic precursor material, at least one anionic precursor ligand, and at least one inert solvent; (3) providing a reaction solution that includes at least a second surface stabilizing ligand that may be the same or different than the first surface stabilizing ligand, and at least one inert solvent; (4) heating each of the cationic precursor mixture, the anionic precursor mixture, and the reaction solution to a temperature in a range from about 50° C. to about 130° C. while stirring under an inert-gas atmosphere; (5) injecting a quantity of the cationic precursor mixture and a quantity of the anionic precursor mixture into the reaction solution while maintaining the temperature, the stirring, and the inert-gas atmosphere, so as to form a reaction mixture; and (6) reacting the cationic precursor mixture and the anionic precursor mixture in the reaction mixture while maintaining the temperature, the stirring, and the inert-gas atmosphere for a period of time between about 1 minute and about 96 hours so as to form the nanocrystals.

As discussed in the introduction, the concentration of precursor materials and the concentration of surface stabilizing ligands are important factors in determining the rate of nanocrystal growth, the size and shape of the nanocrystals, and their degree of monodispersity.

As such, in one embodiment the quantity of anionic and cationic precursor materials added to the reaction solution to form the reaction mixture can include a molar excess of both the anionic and cationic precursor materials relative to the numbers of nanocrystals formed. In another embodiment, the quantity of anionic and cationic precursor materials can be limiting. In a related embodiment, the molar ratio of the anionic and cationic precursor materials added to form the reaction mixture can range from about 100:1 to about 1:100, with the preferred molar ratio being about 5:1 to about 1:5, with the more preferred ratio being about 1:1.

Similarly, in one embodiment the surface stabilizing ligands can be added in molar excess or their concentration can be limiting. In one embodiment, the molar ratio of the nanocrystals to the surface stabilizing ligand can range from about 1:1 to about $1:1 \cdot 10^5$.

3. Examples

Methods described herein can be used to for the synthesis of substantially monodisperse colloidal nanocrystals via an organometallic nucleation and crystallization route at low temperature (50-130° C.). The synthesis typically starts with preparing cationic and anionic molecular precursor solutions. These solutions are then injected into a reaction flask containing surface-stabilizing ligands and an inert solvent at temperatures ranging from 50 to 130° C. under an inert-gas atmosphere (air and moisture-free conditions). The reaction mixture is stirred at a given temperature for several seconds to several days, depending on the desired end-size of the nanocrystals and the chosen reaction temperature.

When the desired size of the nanocrystals is reached, as monitored, for example, by time, spectroscopic properties, or size observed in a transmission electron microscope, the reaction is stopped by cooling the reaction mixture to room temperature and separating the synthesized nanocrystals from the growth mixture (solvent, unreacted ligands and precursors). An exemplary purification method includes (1) extracting the nanocrystals from the reaction mixture using at least one solvent that is immiscible in the reaction mixture, (2) precipitating the nanocrystals out of the extraction solvent and separating the precipitated nanocrystals from the extraction solvent by centrifugation, (3) suspending the nanocrystals in a fresh solvent. Appropriate fresh solvents include, but are not limited to, hexanes, toluene, and/or chloroform. Purified and re-dissolved nanocrystals are used for structural (transmission electron microscopy) and optical (UV-vis absorption and photoluminescence spectroscopy) characterization studies.

Example 1

Low-Temperature Synthesis of Cadmium Selenide Nanocrystals

Cationic precursor solution (solution A): Cadmium acetate (0.1276 g), oleic acid (1.2 mL), and octadecene (11 mL) are filled into a round flask. This mixture is heated to a temperature of 130° C. with stirring under argon gas atmosphere. The heating temperature is maintained at 130° C. until the cadmium acetate is fully dissolved.

Anionic precursor solution (solution B): Metallic selenium (0.315 g), trioctylphoshine (17 mL) and 1.8 mL toluene are filled into a round flask. This mixture is stirred at room temperature under argon gas until the selenium is fully dissolved.

Reaction solution (solution C): Chosen ligand and solvent, for example octadecylamine (0.5 g) and octadecene (10 mL), are filled into a round flask. Under argon gas atmosphere and stirring, this mixture is heated to the desired injection temperature.

When solution C has reached the desired injection temperature, for example 130° C., the same amount (0.5-10 mL) of solution A and solution B are simultaneously injected into solution C with the reaction temperature maintained at the injection temperature under argon gas atmosphere and constant stirring. The nanocrystals are then allowed to undergo nucleation and growth for a given time. For example, at this reaction condition and using 5 mL of solutions A and B for injections, the synthesis time for nanocrystals with a diameter of 3.2 nm is 120 minutes.

The CdSe nanocrystal synthesis is stopped by cooling the reaction mixture to room temperature. The CdSe nanocrystals are separated from the reaction mixture by first adding 10 mL of hexanes and 20 mL methanol to the reaction mixture. This results in the formation of two liquid layers with the nanocrystals dissolved in the upper (hexanes) layer which are extracted. This is followed by the addition of 15 mL acetone to the extracted nanocrystal solution. Under this condition, the nanocrystals precipitate out of the growth solution and can be separated from it by centrifugation. The separated and purified nanocrystals are then re-dissolved in appropriate amounts of solvent (such as hexane, toluene, or chloroform) and characterized.

Example 2

Low-Temperature Synthesis of Cadmium Selenide Nanocrystals

Cationic precursor solution (solution A): Cadmium oxide (0.0615 g), oleic acid (1.2 mL), and octadecene (11 mL) are filled into a round flask. This mixture is heated to a temperature of 200° C. with stirring under argon gas atmosphere. The heating temperature is maintained at 200° C. until the cadmium oxide is fully dissolved. When the solution has turned colorless, it is cooled down to the desired injection temperature, for example 130° C.

Anionic precursor solution (solution B): Metallic selenium (0.315 g), trioctylphoshine (17 mL) and 1.8 mL toluene are filled into a round flask. This mixture is stirred at room temperature under argon gas until the selenium is fully dissolved.

Reaction solution (solution C): Chosen ligand and solvent, for example octadecylamine (0.5 g) and octadecene (10 mL), are filled into a round flask. Under argon gas atmosphere and stirring, this mixture is heated to the desired injection temperature.

When solution C has reached the desired injection temperature, for example 130° C., the same amount (0.5-10 mL) of solution A and solution B are simultaneously injected into solution C with the reaction temperature maintained at the injection temperature under argon gas atmosphere and constant stirring. The nanocrystals are then allowed to undergo nucleation and growth for a given time until the nanocrystal have a desired sized and/or properties. The CdSe nanocrystal synthesis is stopped by cooling the reaction mixture to room temperature. The CdSe nanocrystals are separated from the reaction mixture using the procedure described herein.

Example 3

Low-Temperature Synthesis of Cadmium Selenide Nanocrystals

Cationic precursor solution (solution A): Cadmium acetate dihydrate (0.1276 g), octanoic acid (0.6 mL), and octadecene (11 mL) are filled into a round flask. This mixture is heated to a temperature of 130° C. with stirring under argon gas atmosphere. The heating temperature is maintained at 130° C. until the cadmium acetate is fully dissolved.

Anionic precursor solution (solution B): Metallic selenium (0.315 g), trioctylphoshine (17 mL) and 1.8 mL toluene are filled into a round flask. This mixture is stirred at room temperature under argon gas until the selenium is fully dissolved.

Reaction solution (solution C): Chosen ligand and solvent, for example octadecylamine (0.5 g) and octadecene (10 mL), are filled into a round flask. Under argon gas atmosphere and stirring, this mixture is heated to the desired injection temperature.

When solution C has reached the desired injection temperature, for example 130° C., the same amount (0.5-10 mL) of solution A and solution B are simultaneously injected into solution C with the reaction temperature maintained at the injection temperature under argon gas atmosphere and constant stirring. The nanocrystals are then allowed to undergo nucleation and growth for a given time until the nanocrystal have a desired sized and/or properties. The CdSe nanocrystal synthesis is stopped by cooling the reaction mixture to room temperature. The CdSe nanocrystals are separated from the reaction mixture using the procedure described herein.

Example 4

Low-Temperature Synthesis of Cadmium Selenide Nanocrystals

Cationic precursor solution (solution A): Cadmium acetate dihydrate (0.1276 g), oleic acid (1.2 mL), and octadecene (11 mL) are filled into a round flask. This mixture is heated to a temperature of 130° C. with stirring under argon gas atmosphere. The heating temperature is maintained at 130° C. until the cadmium acetate is fully dissolved.

Anionic precursor solution (solution B): Metallic selenium (0.2266 g), trioctylphoshine (2.4 mL) and 10.4 mL toluene are filled into a round flask. This mixture is stirred at room temperature under argon gas until the selenium is fully dissolved.

Reaction solution (solution C): Chosen ligand and solvent, for example octadecylamine (0.5 g) and octadecene (10 mL), are filled into a round flask. Under argon gas atmosphere and stirring, this mixture is heated to the desired injection temperature.

When solution C has reached the desired injection temperature, for example 130° C., the same amount (0.5-10 mL) of solution A and solution B are simultaneously injected into solution C with the reaction temperature maintained at the injection temperature under argon gas atmosphere and constant stirring. The nanocrystals are then allowed to undergo nucleation and growth for a given time until the nanocrystal have a desired sized and/or properties. The CdSe nanocrystal synthesis is stopped by cooling the reaction mixture to room temperature. The CdSe nanocrystals are separated from the reaction mixture using the procedure described herein.

Example 5

Low-Temperature Synthesis of Cadmium Selenide Nanocrystals

Cationic precursor solution (solution A): Cadmium acetate dihydrate (0.1276 g), oleic acid (1.2 mL), and octadecene (11 mL) are filled into a round flask. This mixture is heated to a temperature of 130° C. with stirring under argon gas atmosphere. The heating temperature is maintained at 130° C. until the cadmium acetate is fully dissolved.

Anionic precursor solution (solution B): Metallic selenium (0.315 g), trioctylphoshine (17 mL) and 1.8 mL toluene are filled into a round flask. This mixture is stirred at room temperature under argon gas until the selenium is fully dissolved.

Reaction solution (solution C): Chosen ligand and solvent, for example octylamine (0.31 mL) and octadecene (10 mL), are filled into a round flask. Under argon gas atmosphere and stirring, this mixture is heated to the desired injection temperature.

When solution C has reached the desired injection temperature, for example 130° C., the same amount (0.5-10 mL) of solution A and solution B are simultaneously injected into solution C with the reaction temperature maintained at the injection temperature under argon gas atmosphere and constant stirring. The nanocrystals are then allowed to undergo nucleation and growth for a given time until the nanocrystal have a desired sized and/or properties. The CdSe nanocrystal synthesis is stopped by cooling the reaction mixture to room temperature. The CdSe nanocrystals are separated from the reaction mixture using the procedure described herein.

Example 6

Low-Temperature Synthesis of Lead Selenide Nanocrystals

Cationic precursor solution (solution A): Lead(II)acetate trihydrate (0.36 g), oleic acid (2.4 mL), and diphenyl ether (11 mL) are filled into a round flask. This mixture is heated to a temperature of 130° C. with stirring under argon gas atmosphere. The temperature is maintained at 130° C. until the lead(II)acetate trihydrate is fully dissolved.

Anionic precursor solution (solution B): Metallic selenium (0.315 g), trioctylphoshine (17 mL) and 1.8 mL toluene are filled into a round flask. This mixture is stirred at room temperature under argon gas until the selenium is fully dissolved.

Reaction solution (solution C): Chosen ligand and solvent, for example octadecylamine (0.5 g) and octadecene (10 mL), are filled into a round flask. Under argon gas atmosphere and stirring, this mixture is heated to the desired injection temperature.

When solution C has reached the desired injection temperature, for example 130° C., the same amount (0.5-10 mL) of solution A and solution B are simultaneously injected into solution C with the reaction temperature maintained at the injection temperature under argon gas atmosphere and constant stirring. The nanocrystals are then allowed to undergo nucleation and growth for a given time until the nanocrystal have a desired sized and/or properties. The PbSe nanocrystal synthesis is stopped by cooling the reaction mixture to room temperature. The PbSe nanocrystals are separated from the reaction mixture using the procedure described herein.

Example 7

Low-Temperature Synthesis of Other Nanocrystals

The methods described herein can be used for low-temperature growth of nanocrystals other than cadmium selenide and lead selenide, including, but not restricted to, cadmium chalcogenide, lead chalcogenide, zinc chalcogenide, and mercury chalcogenide nanocrystals; other types of nanocrystals such as oxides, phosphides, nitrides, and arsenides; metals such as gold, silver, cobalt, platinum, nickel, iron, and copper.

Other type of surface-stabilizing ligands can be used for the invented low-temperature growth process, including, but not restricted to, alkyl carboxylic acids, alkyl amines, alkyl phosphines, and alkyl sulfides.

The reaction solvent is not restricted. Other solvents can be used (depending on the chosen reaction temperature), including, but not restricted to, alkanes, alkenes, phenyl ethers, toluene, squalane, and chloro and fluoro alkanes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for synthesizing semiconductor nanocrystals, comprising:
    forming a reaction mixture in a reaction vessel while stirring under an inert-gas atmosphere at a temperature in a range from about 35° C. to about 130° C., the reaction mixture including:
        at least one solvent, a cationic precursor, an anionic precursor, and at least a first surface stabilizing ligand; and
    growing semiconductor nanocrystals in the reaction mixture for a period of time between about 1 minute and about 96 hours while maintaining the temperature, the stirring, and the inert-gas atmosphere, wherein:
        the at least one solvent includes at least one of an alkane, an alkene, a phenyl ether, a chloro alkane, a fluoro alkane, toluene, or squalene, the at least one solvent having a boiling point in a range from about 80° C. to about 350° C.;
        the cationic precursor includes:
            a cationic precursor material,
            at least a second surface stabilizing ligand that is the same as or different than the first surface stabilizing ligand, and
            the at least one solvent;
        the anionic precursor includes:
            a precursor material,
            at least one anionic precursor ligand, and
            the at least one solvent.

2. The method of claim 1, wherein the temperature is in a range from about 50° C. to about 130° C.

3. The method of claim 1, the at least one solvent having a boiling point in a range from about 100° C. to about 300° C.

4. The method of claim 1, the at least one solvent having a boiling point in a range from about 110° C. to about 280° C.

5. The method of claim 1, the first and the second surface stabilizing ligand including at least one of an alkyl carboxylic acid, an alkyl amine, an alkyl phosphine, an alkyl phosphonic acid, or an alkyl sulfide, the surface stabilizing ligand having an aliphatic chain that includes at least four carbon atoms.

6. The method of claim 1, the cationic precursor material including at least one organometallic compound of cadmium, lead, zinc, mercury, gold, silver, cobalt, platinum, nickel, iron, or copper.

7. The method of claim 6, wherein the organometallic compound includes metallic $C_2$-$C_{20}$ carboxylic acid salts, and derivatives thereof.

8. The method of claim 1, the anionic precursor material including at least one sulfide, selenide, telluride, phosphide, nitride, or arsenide.

9. The method of claim 1, wherein the anionic precursor ligand is a trialkylphosphine.

10. The method of claim 9, the trialkylphosphine being selected from the group consisting of trimethylphosphine, triethylphosphine, tributylphosphine, tripropylphosphine, tripentylphosphine, trihexylphosphine, triheptylphosphine, trioctylphosphine, triphenyl phosphine, tris(p-anisyl)phosphine, tri-n-butylphosphine, tris(p-tolyl)phosphine, tri-n-propylphosphine, tricyclohexyl phosphine, tris(hydroxymethyl)phosphine, tris(2-cyanoethyl)phosphine, tri-isobutylphosphine, tris(3-hydroxypropyl)phosphine, di-tert-butylmethylphosphine, tris(o-tolyl)phosphine, tris(m-tolyl)phosphine, tricyclopentylphosphine, tert-butyldimethylphosphine, n-butyldicyclohexylphosphine, or (2-biphenylyl)di-tert-butylphosphine, and combinations thereof.

11. The method of claim 10, where in the trialkylphosphine is trioctylphosphine.

12. The method of claim 1, wherein the inert gas is selected from the group consisting of argon, nitrogen, or helium, and combinations thereof.

13. The method of claim 1, further comprising:
    periodically extracting samples from the reaction mixture; and
    monitoring growth of the nanocrystals in the reaction mixture using one or more of UV-vis absorption spectroscopy, photoluminescence emission spectroscopy, and/or transmission electron microscopy.

14. The method of claim 1, further comprising stopping growth of the nanocrystals by cooling the reaction mixture to ambient temperature.

15. The method of claim 1, further comprising purifying the nanocrystals from the reaction mixture, the purifying including:
    extracting the nanocrystals from the reaction mixture using at least one solvent that is immiscible in the reaction mixture;
    precipitating the nanocrystals out of the extraction solvent and separating the precipitated nanocrystals from the extraction solvent by centrifugation; and
    suspending the nanocrystals in a fresh solvent.

16. A method for colloidal synthesis of nanocrystals, comprising:

forming a reaction mixture under an inert atmosphere, the reaction mixture including:
  at least one solvent selected from the group consisting of an alkane, an alkene, a phenyl ether, a chloro alkane, a fluoro alkane, toluene, or squalene, and combinations thereof;
  a first surface stabilizing ligand having an aliphatic chain that includes at least four carbon atoms selected from the group consisting of an alkyl carboxylic acid, an alkyl amine, an alkyl phosphine, an alkyl phosphonic acid, an alkyl sulfide, and combinations thereof;
  a cationic precursor solution including at least one compound of cadmium, lead, zinc, mercury, gold, silver, cobalt, platinum, nickel, iron, or copper, a second surface stabilizing ligand that is the same as or different than the first surface stabilizing ligand, and the at least one solvent;
  an anionic precursor solution including at least one sulfide, selenide, telluride, phosphide, nitride, or arsenide, at least one anionic precursor ligand, and the at least one solvent; and
stirring the reaction mixture under the inert-gas atmosphere at a temperature in a range from about 35° C. to about 130° C.;
growing nanocrystals in the reaction mixture while maintaining the temperature, the stifling, and the inert-gas atmosphere, wherein a molar ratio of the nanocrystals to the surface stabilizing ligand ranges from 1:1 to 1:1× $10^5$; and
purifying the nanocrystals from the reaction mixture.

17. The method of claim 16, the at least one solvent having a boiling point in a range from about 80° C. to about 350° C.

18. The method of claim 16, the at least one solvent having a boiling point in a range from about 100° C. to about 300° C.

19. The method of claim 16, the at least one solvent having a boiling point in a range from about 110° C. to about 280° C.

20. The method of claim 16, the anionic precursor ligand being a trialkylphosphine.

21. The method of claim 16, further comprising:
  monitoring growth of the nanocrystals in the reaction mixture using one or more of UV-vis absorption spectroscopy, photoluminescence emission spectroscopy, and/or transmission electron microscopy; and
  stopping growth of the nanocrystals by cooling the reaction mixture to ambient temperature when the nanocrystals reach a selected size.

22. The method of claim 21, wherein the selected size of the nanocrystals is less than about 100 nm in one or more dimensions.

23. The method of claim 21, wherein the selected size of the nanocrystals is less than about 50 nm in one or more dimensions.

24. The method of claim 21, wherein the selected size of the nanocrystals is less than about 30 nm in one or more dimensions.

25. The method of claim 21, wherein the selected size of the nanocrystals is less than about 10 nm in one or more dimensions.

26. The method of claim 16, further comprising growing the nanocrystals in the reaction mixture for a period of time in a range from about 1 minute to about 96 hours.

27. The method of claim 16, further comprising growing the nanocrystals in the reaction mixture for a period of time in a range from about 5 minutes to about 48 hours.

28. The method of claim 16, further comprising growing the nanocrystals in the reaction mixture for a period of time in a range from about 1 hour to about 24 hours.

29. A method for colloidal synthesis of semiconductor nanocrystals, comprising:
  forming a cationic precursor mixture, including:
    at least one cationic precursor material;
    at least a first surface stabilizing ligand; and
    at least one solvent selected from the group consisting of an alkane, an alkene, a phenyl ether, a chloro alkane, a fluoro alkane, toluene, squalene, and combinations thereof;
  forming an anionic precursor mixture, including:
    at least one anionic precursor material;
    at least one anionic precursor ligand; and
    at least one solvent selected from the group consisting of an alkane, an alkene, a phenyl ether, a chloro alkane, a fluoro alkane, toluene, squalene, and combinations thereof;
  forming a reaction solution, including
    at least a second surface stabilizing ligand that is the same or different than the first surface stabilizing ligand; and
    at least one solvent selected from the group consisting of an alkane, an alkene, a phenyl ether, a chloro alkane, a fluoro alkane, toluene, squalene, and combinations thereof;
  heating each of the cationic precursor mixture and the reaction solution independently to a temperature in a range from about 35° C. to about 130° C. while stifling under an inert-gas atmosphere;
  stirring the anionic precursor mixture under an inert-gas atmosphere until the least one anionic precursor material is dissolved;
  injecting a quantity of the cationic precursor mixture and a quantity of the anionic precursor mixture into the reaction solution while maintaining the temperature, the stirring, and the inert-gas atmosphere, so as to form a reaction mixture; and
  reacting the cationic precursor mixture and the anionic precursor mixture in the reaction mixture while maintaining the temperature, the stifling, and the inert-gas atmosphere for a period of time between about 1 minute and about 96 hours so as to form the semiconductor nanocrystals.

30. The method of claim 29, the at least one solvent having a boiling point in a range from about 80° C. to about 350° C.

31. The method of claim 29, the at least one solvent having a boiling point in a range from about 100° C. to about 300° C.

32. The method of claim 29, the at least one solvent having a boiling point in a range from about 110° C. to about 280° C.

33. The method of claim 29, the cationic precursor material including at least one organometallic compound of cadmium, lead, zinc, mercury, gold, silver, cobalt, platinum, nickel, iron, or copper.

34. The method of claim 33, wherein the organometallic compound includes metallic $C_2$-$C_{20}$ carboxylic acid salts, and derivatives thereof.

35. The method of claim 29, the first and second surface stabilizing ligands being selected from the group consisting of alkyl carboxylic acids, alkyl amines, alkyl phosphines, alkyl phosphonic acids, or alkyl sulfides, and combinations thereof, the surface stabilizing ligand having an aliphatic chain that includes at least four carbon atoms.

36. The method of claim 29, the anionic precursor material including at least one sulfide, selenide, telluride, phosphide, nitride, or arsenide.

37. The method of claim 29, wherein the anionic precursor ligand is a trialkylphosphine.

38. The method of claim 29, wherein the inert gas is selected from the group consisting of argon, nitrogen, or helium, and combinations thereof.

39. The method of claim 29, further comprising monitoring the growing of the nanocrystals using one or more of UV-vis absorption spectroscopy, photoluminescence emission spectroscopy, or transmission electron microscopy.

40. The method of claim 29, further comprising stopping the growing of the nanocrystals by cooling the reaction mixture to ambient temperature.

41. The method of claim 40, further comprising purifying the nanocrystals from the reaction mixture, the purifying including:
- extracting the nanocrystals from the reaction mixture using at least one solvent that is immiscible in the reaction mixture;
- precipitating the nanocrystals out of the extraction solvent and separating the precipitated nanocrystals from the extraction solvent by centrifugation; and
- suspending the nanocrystals in a fresh solvent.

42. The method of claim 29, further comprising injecting a quantity of the cationic precursor mixture into the reaction solution and then injecting a quantity of the anionic precursor mixture into the reaction solution.

43. The method of claim 29, further comprising injecting a quantity of the anionic precursor mixture into the reaction solution and then injecting a quantity of the cationic precursor mixture into the reaction solution.

* * * * *